(12) United States Patent
Orr

(10) Patent No.: US 7,332,358 B2
(45) Date of Patent: Feb. 19, 2008

(54) MOSFET TEMPERATURE SENSING

(75) Inventor: Raymond K. Orr, Kanata (CA)

(73) Assignee: Potentia Semiconductor Inc., Wilmington, DE (US)

( * ) Notice: Subject to any disclaimer, the term of this patent is extended or adjusted under 35 U.S.C. 154(b) by 36 days.

(21) Appl. No.: 11/169,637

(22) Filed: Jun. 30, 2005

(65) Prior Publication Data

US 2007/0004054 A1    Jan. 4, 2007

(51) Int. Cl.
H01L 21/00 (2006.01)
H01L 23/58 (2006.01)

(52) U.S. Cl. .................. 438/10; 438/17; 257/48; 257/467

(58) Field of Classification Search .............. 438/10, 438/11, 17, 18, 238, 239; 257/48, 340, 341, 257/467, 469
See application file for complete search history.

(56) References Cited

U.S. PATENT DOCUMENTS 5,457,419 A * 10/1995 Tihanyi ............... 327/378
5,828,263 A * 10/1998 Gantioler et al. ........... 257/378
6,671,152 B1 * 12/2003 Hersel et al. ............... 327/378
6,812,722 B2 * 11/2004 Throngnumchai et al. .. 324/760
6,949,961 B2 * 9/2005 Robb et al. ................ 257/341
2003/0076154 A1 * 4/2003 Shakeri et al. ............. 327/534
2006/0107241 A1 * 5/2006 Tanabe ......................... 716/4

OTHER PUBLICATIONS

"International IOR Rectifier"; IRLBD59N04E; HEXFET® Power MOSFET; Nov. 13, 2001; pp. 1-8.
"Principle of the temperature sense concept of the Speed-TEMPFET family"; Benno Köppl; Temperature sense concept-Speed Tempfet®; May 1999; pp. 1-6.
"Temperature Sensing Power MOSFET"; Vishay Siliconix; AN820; Document No. 71621; Jul. 13, 2001; pp. 1-7.

* cited by examiner

Primary Examiner—Kevin M. Picardat

(57) ABSTRACT

A MOSFET has its gate voltage controlled to provide a constant drain current of the MOSFET, for example to limit inrush current for charging a capacitance of a power supply arrangement. A decrease in the gate voltage supplied to the MOSFET, corresponding to an increase in the junction temperature of the MOSFET, by more than a determined amount is detected and used to reduce the gate voltage, and hence the drain current, for example to zero, to prevent heating of the MOSFET beyond a maximum operating temperature.

20 Claims, 2 Drawing Sheets

MOSFET TEMPERATURE SENSING

This invention relates to MOSFET temperature sensing, and is particularly concerned with sensing temperature of a MOSFET junction while it is conducting a controlled drain current. The term "sensing" is used herein in a broad sense to include monitoring and/or limiting, for example for protecting a MOSFET from damage due to excessive temperatures. The term "junction" is used herein to mean the internal parts of the MOSFET such as the gate and channel, the temperature of which is commonly referred to as the junction temperature and which may alternatively be referred to as the MOSFET die temperature, as distinct from, for example, the external or case temperature of the MOSFET.

BACKGROUND

It is known to provide a MOSFET with on-die or internal temperature protection. For example, as described in Infineon Technologies' Application Note entitled "Temperature sense concept—Speed Tempfet®—Principle of the temperature sense concept of the Speed-TEMPFET family" by Benno Köppl, May 1999, a temperature sensing thyristor can be mounted on a MOSFET using chip-on-chip technology, the thyristor either being connected in parallel with the gate-source electrodes of the MOSFET within the device or having external connections. In the former case the thyristor fires to reduce the MOSFET gate-source voltage, thereby turning off the MOSFET, when its temperature exceeds a trip level; this has the disadvantage of requiring a series gate resistor, which limits the MOSFET switching speed. In the latter case, external circuitry, such as a microcontroller, driver IC (integrated circuit), or discrete circuitry, is required to monitor and respond to the thyristor state.

It is also known to integrate anti-parallel electrically isolated polysilicon diodes on a MOSFET die for temperature sensing, for example as described in Vishay Application Note AN820 entitled "Temperature Sensing Power MOSFET" by K. Pandya, 13 Jul. 2001, or International Rectifier device IRLBD59N04E Data Sheet, Nov. 13, 2001. With such devices, an external circuit is used to sense temperature based on the temperature-dependent forward voltage drop of the diodes.

These known arrangements require the use of specific MOSFET devices from respective manufacturers to provide the temperature sensing and any protection facilitated thereby. It is desirable to provide MOSFET junction temperature sensing in a manner that facilitates the use of a wide range of MOSFETs that do not incorporate such temperature sensing facilities.

One application of a power MOSFET is for switching a supply voltage to one or more switch mode power supplies which produce relatively low voltages for supply to electronic circuits. Typically, for example, the supply voltage may have a nominal value of 48V, and typically this is smoothed by a capacitance on the switched or output side of the power MOSFET. When the supply voltage is initially connected with the capacitance discharged, there is a substantial inrush current as the capacitance is charged from zero volts towards the supply voltage. At this time the inrush current is typically limited by controlling the MOSFET so that it is not fully enhanced (fully turned on to provide a low resistance). Conveniently the MOSFET gate voltage is controlled so that the MOSFET conducts a substantially constant drain current. Consequently, before the MOSFET is fully enhanced, the MOSFET is subject to a very high power dissipation.

For example, assuming a supply voltage of 50V and a constant current of 5 A for charging the capacitance, the MOSFET is subject to a power dissipation of 250 W during this turn-on period. The energy dissipated in the MOSFET may be tens of joules in a short period of for example 500 µs, depending on the charging current and the size of the capacitance. In contrast, a peak current of the order of 30 times higher would be required during subsequent operation, when the MOSFET is fully enhanced and has a low drain-source resistance, for a similar power dissipation in the MOSFET.

Accordingly, the junction or die of such a MOSFET is particularly prone to excessive temperature rise as a result of the inrush current, and it is under such circumstances that temperature sensing and limiting may be particularly likely to be required.

There is therefore a need to facilitate temperature sensing, including temperature limiting, of MOSFETs.

SUMMARY OF THE INVENTION

According to one aspect of this invention there is provided a method of sensing junction temperature of a MOSFET, comprising the steps of: controlling a gate voltage of the MOSFET to control a drain current of the MOSFET; determining a first value of the gate voltage at a first temperature of the MOSFET junction; and sensing a change of the gate voltage from the first value, the change of the gate voltage representing a change in temperature of the MOSFET junction from the first temperature.

Preferably the gate voltage of the MOSFET is controlled to maintain a substantially constant drain current of the MOSFET.

The method preferably further comprises the steps of determining a voltage change threshold representing a change in temperature of the MOSFET junction from the first temperature to a second temperature, and controlling the gate voltage of the MOSFET to reduce the drain current in response to a change of the gate voltage crossing the voltage change threshold. In an form of this method, the drain current is reduced to substantially zero.

The step of sensing a change of the gate voltage from the first value can comprise comparing the gate voltage with a sample of the gate voltage at the first temperature of the MOSFET junction modified by a voltage offset representing a change of the gate voltage for a change in temperature of the MOSFET junction from the first temperature to the second temperature. Conveniently the first temperature can be an ambient temperature and the second temperature can be substantially a maximum junction temperature of the MOSFET.

Another aspect of the invention provides a method of limiting temperature of a MOSFET connected in series with a capacitance for limiting inrush current for charging the capacitance towards a supply voltage, comprising the steps of: controlling a gate voltage supplied to a gate of the MOSFET to limit drain current of the MOSFET; determining an amount for a change of the gate voltage corresponding to a limited increase in junction temperature of the MOSFET; monitoring the gate voltage; and in response to the monitored gate voltage changing by at least said amount, controlling the MOSFET to reduce the drain current.

Conveniently the MOSFET is controlled to reduce the drain current, for example to substantially zero, by reducing the gate voltage.

Preferably the step of controlling the gate voltage to limit drain current of the MOSFET comprises limiting the drain current of the MOSFET to a substantially constant value.

According to another aspect, the invention provides a circuit arrangement comprising: a control circuit responsive to current of a MOSFET and a reference voltage for supplying to the MOSFET a gate voltage controlled to limit drain current of the MOSFET to a maximum value; and a sensing circuit for sensing changes of the gate voltage thereby to sense temperature changes of the MOSFET.

Desirably the control circuit is responsive to the sensing circuit detecting a change of the gate voltage corresponding to an increase in temperature of the MOSFET beyond a desired amount to control the gate voltage to reduce the drain current of the MOSFET, for example to substantially zero.

Conveniently the control circuit can comprise a resistor for providing a voltage representing drain current of the MOSFET, and an amplifier responsive to differences between the voltage provided by the resistor and the reference voltage for controlling the gate voltage supplied to the MOSFET.

In one form of the circuit arrangement, the sensing circuit comprises a sampling circuit for providing a sample of the gate voltage at a first temperature of the MOSFET, a source of a voltage offset representing a change of gate voltage of the MOSFET corresponding to a change from a first temperature to a second temperature of the MOSFET, and a comparator for comparing the gate voltage with the sample modified by the voltage offset, the control circuit being responsive to an output of the comparator for controlling the gate voltage to reduce the drain current of the MOSFET.

For example, the second temperature can be substantially a maximum junction temperature for the MOSFET and the control circuit can be responsive to the output of the comparator for controlling the gate voltage to reduce the drain current of the MOSFET to substantially zero. Conveniently the sensing circuit is arranged to provide said sample at substantially an ambient temperature of the MOSFET.

BRIEF DESCRIPTION OF THE DRAWINGS

The invention will be further understood from the following description by way of example with reference to the accompanying drawings, in which.

DETAILED DESCRIPTION

Figure 1:
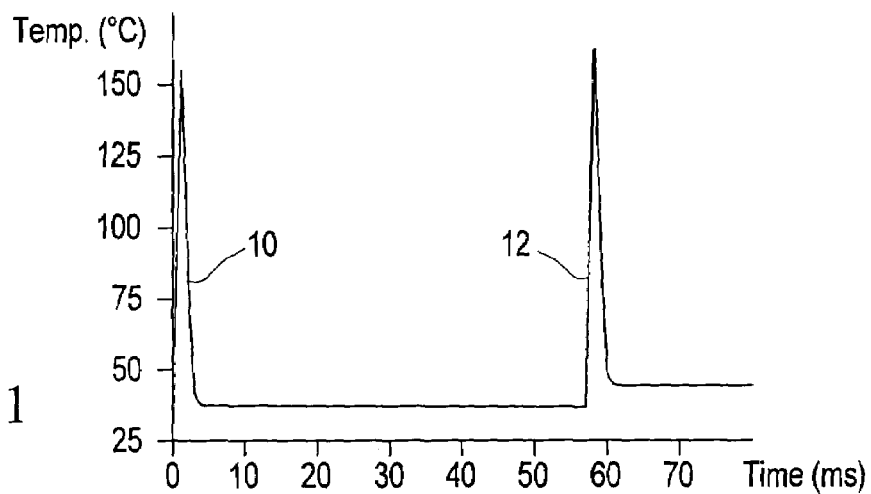
FIGS. 1 and 2 are graphs of MOSFET junction or die temperature as a function of time, with different time scales.
Figure 2:
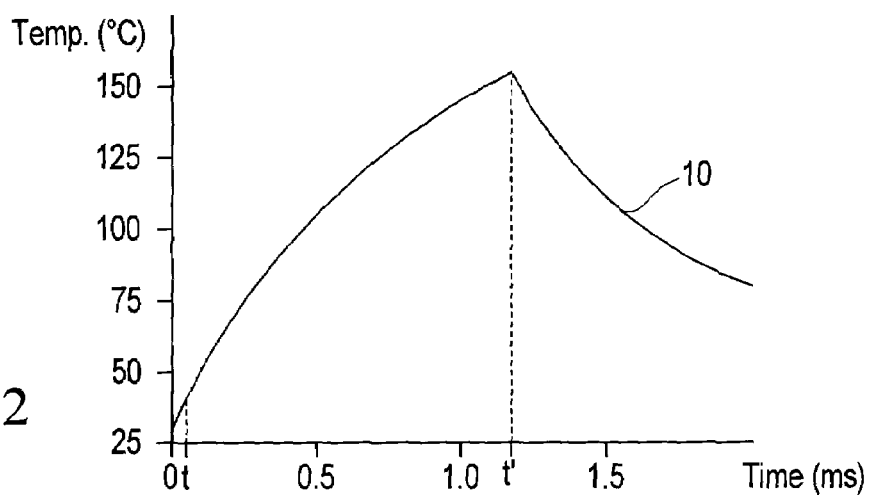

Referring to the drawings, FIGS. 1 and 2 illustrate as a function of time the junction or die temperature of a MOSFET, in this case a type IRF6644 MOSFET having a specified maximum junction temperature of 150° C., calculated for a constant drain current of 5 A and a supply voltage of 50V, representing the current-limited inrush current conditions for charging an initially discharged capacitance as discussed above. With an initial ambient temperature of 30° C., it can be seen that the power in the MOSFET heats the junction very rapidly, so that it reaches a temperature in excess of the maximum of 150° C. in about 1.2 ms, at a time t' shown in FIG. 2.

The graphs in FIGS. 1 and 2 assume that the MOSFET is turned off at this time t' by having its gate-source voltage Vgs reduced to zero, so that the junction or die temperature falls quickly, as shown by a line 10 in each graph. As shown in FIG. 1, the MOSFET die cools to a temperature above the ambient temperature of 30° C., due to overall heating of the die.

As also shown by a line 12 in FIG. 1, a subsequent turn-on of the MOSFET, after a delay of for example more than 50 ms, can again result in the MOSFET junction or die temperature quickly exceeding the 150° C. maximum, with similar results and with the die temperature of the MOSFET again being increased.

It can be appreciated from FIGS. 1 and 2 that temperature increase of a MOSFET junction during inrush current conditions can present a substantial problem. Although the temperature increase can be limited by controlling, for example, the on-time and duty cycle of a MOSFET in a constant current mode as the capacitance is charged, this makes it necessary for careful consideration to be given to the thermal behaviour of the MOSFET. Even if the thermal behaviour is modelled for normal inrush current conditions, the MOSFET can still be over-stressed by abnormal conditions, such as a failed capacitor forming a short-circuit.

Accordingly, it is desirable to sense the MOSFET junction or die temperature under inrush current conditions, and accordingly to protect the MOSFET against excessive temperature increase.

In embodiments of the invention, it is recognized that holding the MOSFET drain current substantially constant during inrush current conditions before the MOSFET is fully enhanced implies that the MOSFET gate-source voltage Vgs is, in a first-order approximation, equal to a threshold value Vgsth of the gate-source voltage plus the product of the transconductance gm of the MOSFET and the MOSFET drain current Id, or $Vgs = Vgsth + gm.Id,$ and the threshold value will change with temperature so that:

$Vgsth = Vgsth(0) + \Delta T.Vgstc$ where Vgsth(0) is the gate-source threshold voltage at a given temperature, $\Delta T$ is a temperature difference from the given temperature, and Vgstc is a temperature coefficient of the gate-source voltage.

Consequently, in embodiments of the invention it is recognized that changes of the gate-source voltage of the MOSFET can be used under conditions of constant drain current as an indication of the MOSFET junction or die temperature. This is illustrated by FIG. 3, which shows the gate-source voltage Vgs of a MOSFET under the same conditions and to the same time scale as FIG. 2.

Figure 3:
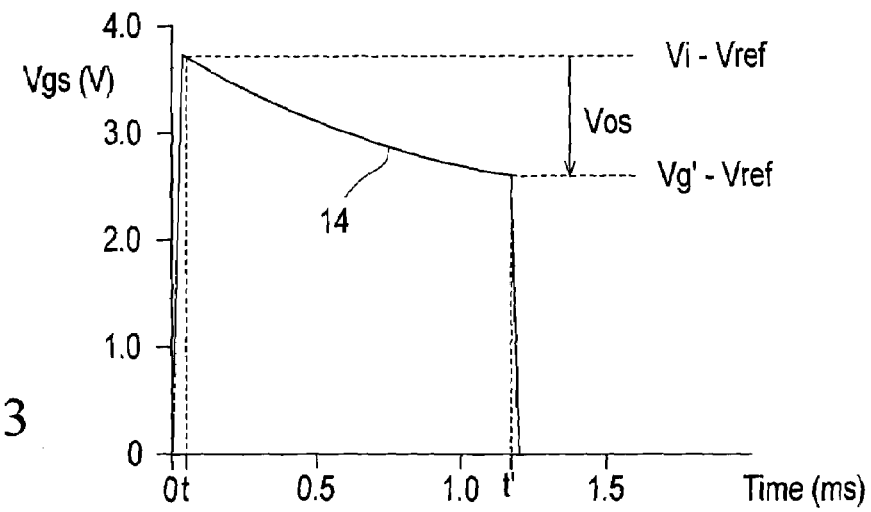
FIG. 3 is a graph of MOSFET gate-source voltage as a function of time, with the same time scale and drain current as for the graph in FIG. 2.

As shown in FIG. 3, the MOSFET is turned on at time 0, its gate-source voltage vgs rising rapidly to a value dependent upon the initial or ambient temperature. As shown by a line 14, with the constant drain current discussed above the MOSFET gate-source voltage Vgs falls as the MOSFET junction or die temperature, as shown in FIG. 2, rises. Thus there is a first-order correlation between rising junction temperature and falling gate-source voltage of the MOSFET. As also shown in FIG. 3, the MOSFET is turned off at the time t' by reducing its gate-source voltage Vgs to zero when the MOSFET junction or die temperature exceeds 150° C. as shown in FIG. 2.

In order to apply these recognitions in a practical way to limit the MOSFET die temperature, the following three steps are carried out with a constant drain current of the MOSFET:
a) determine the gate-source voltage when the MOSFET is initially turned on (the first time, if there are retries such as shown in FIG. 1) while it is at a known temperature;
(b) determine a threshold voltage for turning off the MOSFET, corresponding to a desired maximum die temperature in accordance with the equations above; and
(c) turn off the MOSFET when the gate-source voltage falls below the determined threshold voltage.

For precise accuracy, this requires determining the temperature of the MOSFET junction or die for step (a). In practice, usually the MOSFET will be at the ambient temperature, and it can be sufficient to assume a constant value of ambient temperature, for example 30° C. This enables the threshold voltage determined in step (b) to be a constant value for a specific MOSFET.

For example, with the MOSFET initially at an ambient temperature of 30° C. and having a maximum temperature of 150° C., there can be a temperature rise of 120° C. Multiplying this by the (negative) temperature coefficient for the gate-source voltage Vgs for the MOSFET, which can be obtained from data sheets or measurement (for example, this may be of the order of −2 to −15 mV/° C.), gives a gate-source voltage change for this temperature change. This voltage change can be summed with the determined initial gate-source voltage to provide a value of gate-source voltage which corresponds to the MOSFET reaching its maximum temperature.

Figure 4:
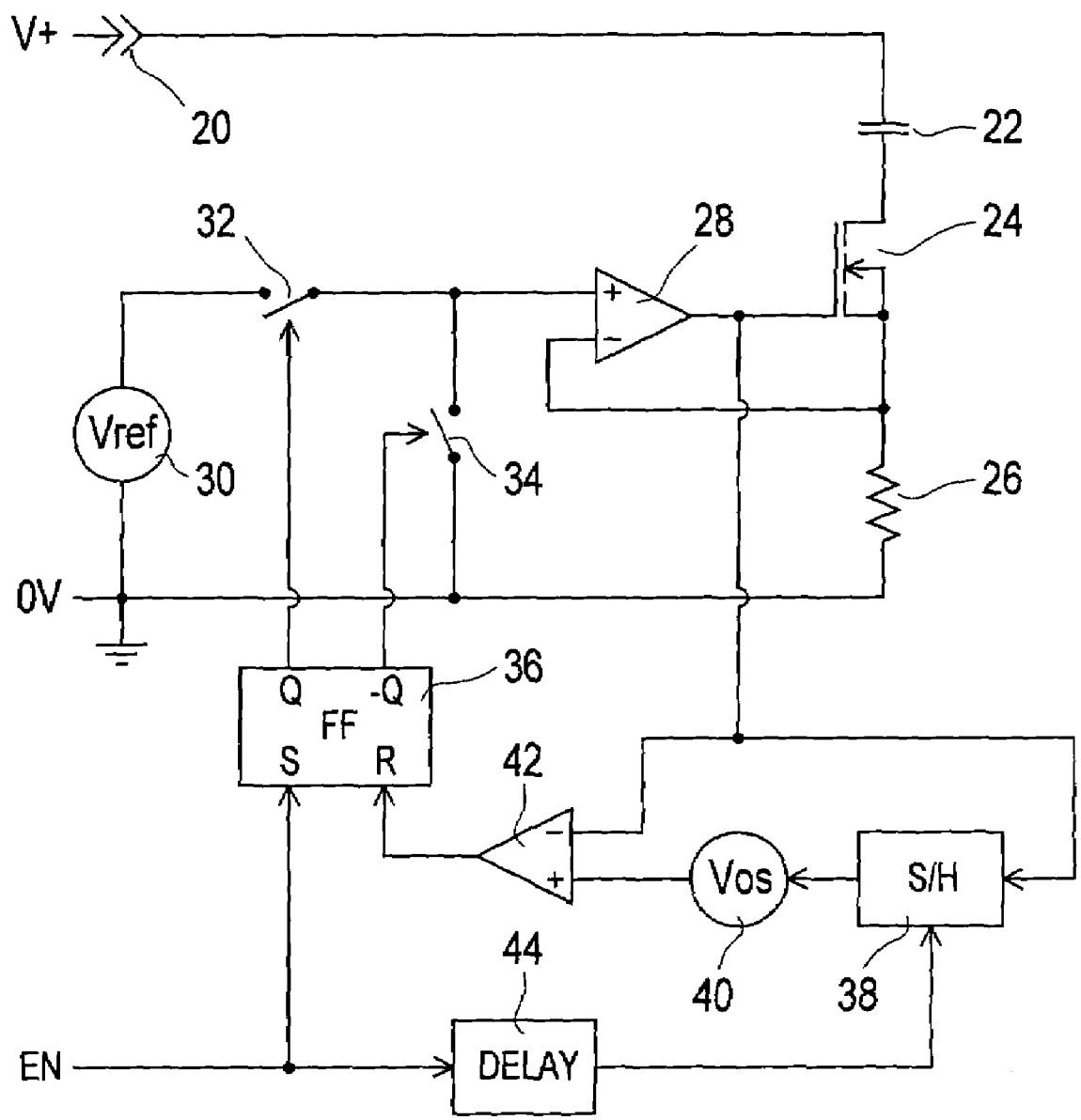
FIG. 4 schematically illustrates a power MOSFET switch circuit with a junction temperature limiting circuit in accordance with an embodiment of this invention.

FIG. 4 illustrates a power MOSFET switch circuit with a temperature limiting circuit in accordance with an embodiment of this invention, showing one example of an implementation of these steps.

Referring to FIG. 4, a switch circuit from a voltage V+ to a ground point at zero volts (0V) is shown extending via a connector 20, a capacitance 22, the drain-source path of a power MOSFET 24, and a current sensing resistor 26. For example, the voltage V+ can be a supply voltage of nominally 48V which is used to supply a plurality of switch mode power supplies (not shown) which produce lower voltages for supplying circuits on a printed circuit card, the switch mode power supplies deriving their supplies from the voltage to which the capacitance 22 is charged. The circuit of FIG. 4 can be provided on the printed circuit card, and the connector 20 represents a connection to the supply voltage V+ for example when the card is inserted into equipment providing this supply voltage, this giving rise to the inrush current conditions for charging the capacitance 22, as discussed above.

The power MOSFET 24 serves, among other things, to limit the inrush current. To this end, the circuit of FIG. 4 also includes an operational amplifier 28 having an output coupled to the gate of the MOSFET 24, an inverting (−) input connected to a junction between the source of the MOSFET 24 and the current sensing resistor 26, and a non-inverting (+) input which is supplied with a reference voltage Vref from a voltage source 30, in this case via a switch 32 as shown in FIG. 4 and as described further below.

On closing of the connector 20, assuming the capacitance 22 to be initially discharged, then if the switch 32 is closed the amplifier 28 drives the gate of the MOSFET 24 to pass a constant current (i.e. drain current) so that the resistor 26 drops a voltage substantially equal to the reference voltage Vref. Consequently, inrush current which charges the capacitance 22 is limited to this constant MOSFET drain current, equal to the reference voltage Vref divided by the resistance of the current sensing resistor 26.

The temperature limiting circuit in FIG. 4 comprises the switch 32; another switch 34 for coupling the non-inverting input of the amplifier 28 to 0V; a flip-flop (FF) 36 having complementary outputs Q and −Q for controlling the switches 32 and 34 respectively, the flip-flop 36 also having a set input S and a reset input R; a sample-and-hold (S/H) circuit 38; a circuit 40 providing a voltage offset Vos; a voltage comparator 42; and a delay element 44. The output of the amplifier 28, which is at the gate voltage Vg of the MOSFET 24, is supplied to the inverting (−) input of the comparator 42 and to an input of the S/H circuit 38, an output voltage of which is reduced by the offset voltage Vos of the circuit 40 and supplied to the non-inverting (+) input of the comparator 42. An output of the comparator 42 is supplied to the reset input R of the flip-flop 36. The flip-flop is set by an enable signal supplied from an input EN to the set input S; this enable signal is also supplied via the delay element 44 to enable sampling by the S/H circuit 38.

In operation, in its reset state the flip-flop 36 controls the switch 32 to be open and the switch 34 to be closed, so that the gate voltage supplied to the MOSFET 28 by the amplifier 28 is zero and the MOSFET 28 is turned off. After connection of the supply voltage V+ via the connector 20, an enable signal supplied via the input EN to the flip-flop input S sets the flip-flop 36, and its outputs control the switch 32 to be closed and the switch 34 to be open, so that the reference voltage Vref is supplied from the source 30 to the non-inverting input of the amplifier 28. As described above, this results in the MOSFET 24 passing a constant drain current which begins charging the capacitance 22, the temperature of the MOSFET 24 increasing as described above and as illustrated in FIG. 2.

After a short delay provided by the delay element 44 and sufficient to enable the output voltage of the amplifier 28 to become substantially stable, for example at a time t as shown in FIG. 3, the enable signal is supplied to the S/H circuit 38 which accordingly samples and holds a value Vi of the MOSFET gate voltage which is produced by the amplifier 28 at this time. As shown in FIG. 3, this initial gate voltage Vi differs from the prevailing value of the gate-source voltage Vgs by the constant reference voltage Vref, which is dropped across the current sensing resistor 26.

The voltage Vi is reduced by the offset voltage Vos produced by the circuit 40, and a resulting voltage is supplied as a threshold Vg' to the non-inverting input of the comparator 42. FIG. 3 shows a corresponding threshold for the gate-source voltage of the MOSFET, equal to Vg'−Vref. Consequently, when as shown in FIG. 3 the gate voltage supplied to the MOSFET, and to the inverting input of the comparator 42, falls below this threshold, the output of the comparator 42 changes to reset the flip-flop 36, at the time t' in FIG. 3. Selecting the offset voltage Vos in accordance with the MOSFET junction reaching its maximum operating temperature of 150° C. ensures that the MOSFET junction or die temperature is limited to substantially this value.

As shown in FIG. 2, at the time t when the S/H circuit 38 is enabled the MOSFET junction or die temperature may already have increased above the ambient temperature, resulting in a potential error in determining the maximum temperature threshold. This potential error can be reduced by minimizing the delay provided by the delay element 44, with suitably fast operation of the other components of FIG. 4. In addition, or instead, the determination of the offset voltage Vos can be modified to reflect this small temperature increase, thereby eliminating or reducing the potential error, or the offset voltage can be determined for a temperature that is less than the maximum junction temperature of the MOSFET, to provide a suitable safety margin.

In addition, it will be appreciated that a fast response of the comparator 42, flip-flop 36, switches 32 and 34, and amplifier 28 is desirable in order to turn off the MOSFET 24 quickly at the time t' when the comparison threshold is reached. Again in this case the determination of the offset voltage Vos, and hence the comparison threshold, can be made to accommodate a response delay for these components.

The voltage Vref that is dropped by the current sensing resistor 26 can be small for reduced power dissipation in this resistor. Alternatively, the MOSFET can be a current sensing type with a current mirror terminal connected to the current sensing resistor and passing only a predetermined fraction of the total MOSFET drain current, most of which is conducted directly from the MOSFET source terminal to ground or 0V in known manner. In either case, the comparator 42 serves effectively to compare a gate voltage change with the determined offset voltage Vos, so that the magnitude of the reference voltage Vref has no effect on the temperature limiting circuit.

The offset voltage Vos can be determined and provided in any desired manner, for example using an analog circuit or digital logic using a look-up table or responsive to a programmed voltage representing the offset voltage Vos. In addition, as indicated above the initial temperature of the MOSFET can be measured, and this measurement can be used in determining the offset voltage Vos instead of an assumed constant value of ambient temperature.

Although the circuit of FIG. 4 serves only to limit the temperature of the MOSFET 24 as described above, it can be appreciated that similar principles to those described above can be used for monitoring the temperature of a MOSFET operating with substantially constant drain current, and/or for example for controlling the drain current of a MOSFET in accordance with its monitored temperature.

For example, it can be appreciated from the above description that any difference between the prevailing value of the MOSFET gate voltage Vg and its initial value Vi held by the S/H circuit 38 represents a change in the junction or die-temperature of the MOSFET for a constant drain current, and can be used in any desired manner to monitor or sense the MOSFET temperature, with or without any temperature limiting circuit. In addition, it can be appreciated that such a difference can optionally be used to provide a control signal which can be used for any desired purpose.

Furthermore, if the MOSFET transconductance is known so that changes in gate-source voltage associated with changes of drain current are known and can be eliminated (the MOSFET operating with its drain current being determined by the gate-source voltage), then any further difference in gate-source voltage represents a temperature change of the MOSFET and can be sensed and used accordingly.

By way of further example, the offset voltage Vos can be determined and used as described above with reference to FIG. 4, but can be selected to correspond to a temperature lower than the maximum specified temperature of the MOSFET 24. When this MOSFET temperature is reached as determined by the comparator 42, the output of the comparator can be used to switch the reference voltage to a lower value, thereby producing a lower MOSFET drain current and less rapid heating of the MOSFET, the S/H circuit 38 can be enabled again to determine the gate voltage of the MOSFET at this temperature and drain current, and a new offset voltage and comparison voltage can be determined in a similar manner to that described above and corresponding to the maximum temperature of the MOSFET, the MOSFET subsequently being turned off as described above if the comparator determines that the new comparison threshold is exceeded. This example can be extended for multiple temperature ranges or for substantially continuous control of the reference voltage Vref, and hence MOSFET drain current, with sensed MOSFET temperature.

Thus although a particular embodiment of the invention is described above, it can be appreciated that these and numerous other modifications, variations, and adaptations may be made without departing from the scope of the invention as defined in the claims.

The invention claimed is:

1. A method of sensing junction temperature of a MOSFET, comprising the steps of:
controlling a gate voltage of the MOSFET to control a drain current of the MOSFET;
determining a first value of the gate voltage at a first temperature of the MOSFET junction; and
sensing a change of the gate voltage from the first value, the change of the gate voltage representing a change in temperature of the MOSFET junction from the first temperature.

2. A method as claimed in claim 1 wherein the gate voltage of the MOSFET is controlled to maintain a substantially constant drain current of the MOSFET.

3. A method as claimed in claim 2 and further comprising the steps of determining a voltage change threshold representing a change in temperature of the MOSFET junction from the first temperature to a second temperature, and controlling the gate voltage of the MOSFET to reduce the drain current in response to a change of the gate voltage crossing the voltage change threshold.

4. A method as claimed in claim 3 wherein the step of controlling the gate voltage of the MOSFET to reduce the drain current comprises reducing the drain current to substantially zero.

5. A method as claimed in claim 2 wherein the step of determining a first value of the gate voltage at a first temperature of the MOSFET junction comprises sampling the gate voltage at substantially an ambient temperature of the MOSFET.

6. A method as claimed in claim 2 wherein the step of sensing a change of the gate voltage from the first value comprises comparing the gate voltage with a sample of the gate voltage at the first temperature of the MOSFET junction modified by a voltage offset representing a change of the gate voltage for a change in temperature of the MOSFET junction from the first temperature to the second temperature.

7. A method as claimed in claim 2 wherein the second temperature is substantially a maximum junction temperature of the MOSFET.

8. A method of limiting temperature of a MOSFET connected in series with a capacitance for limiting inrush current for charging the capacitance towards a supply voltage, comprising the steps of:
controlling a gate voltage supplied to a gate of the MOSFET to limit drain current of the MOSFET;
determining an amount for a change of the gate voltage corresponding to a limited increase in junction temperature of the MOSFET;
monitoring the gate voltage; and in response to the monitored gate voltage changing by at least said amount, controlling the MOSFET to reduce the drain current.

9. A method as claimed in claim 8 wherein in response to the monitored gate voltage changing by at least said amount, the MOSFET is controlled to reduce the drain current by reducing the gate voltage.

10. A method as claimed in claim 8 wherein the step of controlling the MOSFET to reduce the drain current in response to the monitored gate voltage changing by at least said amount comprises reducing the gate voltage to reduce the drain current to substantially zero.

11. A method as claimed in claim 8 wherein the step of controlling the gate voltage to limit drain current of the MOSFET comprises limiting the drain current of the MOSFET to a substantially constant value.

12. A circuit arrangement comprising:
a control circuit responsive to current of a MOSFET and a reference voltage for supplying to the MOSFET a gate voltage controlled to limit drain current of the MOSFET to a maximum value; and
a sensing circuit for sensing changes of the gate voltage thereby to sense temperature changes of the MOSFET.

13. A circuit arrangement as claimed in claim 12 wherein the control circuit is responsive to the sensing circuit detecting a change of the gate voltage corresponding to an increase in temperature of the MOSFET beyond a desired amount to control the gate voltage to reduce the drain current of the MOSFET.

14. A circuit arrangement as claimed in claim 12 wherein the control circuit is responsive to the sensing circuit detecting a change of the gate voltage corresponding to an increase in temperature of the MOSFET beyond a desired amount to reduce the gate voltage thereby to reduce the drain current of the MOSFET to substantially zero.

15. A circuit arrangement as claimed in claim 12 wherein the control circuit comprises a resistor for providing a voltage representing drain current of the MOSFET, and an amplifier responsive to differences between the voltage provided by the resistor and the reference voltage for controlling the gate voltage supplied to the MOSFET.

16. A circuit arrangement as claimed in claim 12 wherein the sensing circuit comprises a sampling circuit for providing a sample of the gate voltage at a first temperature of the MOSFET, a source of a voltage offset representing a change of gate voltage of the MOSFET corresponding to a change from a first temperature to a second temperature of the MOSFET, and a comparator for comparing the gate voltage with the sample modified by the voltage offset, the control circuit being responsive to an output of the comparator for controlling the gate voltage to reduce the drain current of the MOSFET.

17. A circuit arrangement as claimed in claim 16 wherein the second temperature is substantially a maximum junction temperature for the MOSFET and the control circuit is responsive to the output of the comparator for controlling the gate voltage to reduce the drain current of the MOSFET to substantially zero.

18. A circuit arrangement as claimed in claim 17 wherein the sensing circuit is arranged to provide said sample at substantially an ambient temperature of the MOSFET.

19. A circuit arrangement as claimed in claim 16 wherein the sensing circuit is arranged to provide said sample at substantially an ambient temperature of the MOSFET.

20. A circuit arrangement comprising a MOSFET having a gate voltage controlled to provide a substantially constant drain current of the MOSFET to limit inrush current for charging a capacitance, the circuit arrangement further comprising a circuit for detecting a decrease of the gate voltage corresponding to an increase in temperature of the MOSFET by more than a determined amount and, in response to such detection, to control the gate voltage to reduce the drain current.

* * * * *